United States Patent
Yim et al.

(10) Patent No.: US 6,238,597 B1
(45) Date of Patent: May 29, 2001

(54) PREPARATION METHOD OF ANISOTROPIC CONDUCTIVE ADHESIVE FOR FLIP CHIP INTERCONNECTION ON ORGANIC SUBSTRATE

(75) Inventors: Myung Jin Yim; Kyung Wook Paik, both of Taejeon (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 09/506,708

(22) Filed: Feb. 18, 2000

(30) Foreign Application Priority Data

Mar. 10, 1999 (KR) .................................................. 99-7942

(51) Int. Cl.⁷ .................................................. H01B 1/22
(52) U.S. Cl. ........................ 252/512; 252/514; 252/518.1
(58) Field of Search .................................. 252/512, 514, 252/518.1; 156/330

(56) References Cited

PUBLICATIONS

C.P. Wong et a.; High Performance No–Flow Underfills for Low–Cost Flip–Chip Applications: Material Characterization; IEEE Transactions on Components, Packaging, and Mfg. Technology; Part A, vol. 21, No. 3; Sep. 1998; pp. 1–9.

Gautam Sarkar et al.; Flip Chjip Interconnect Using Anisotropic Conductive Adhesive; *Journal of Materials Processign Technologies;* 1999; pp. 1–7.

*Primary Examiner*—Mark Kopec
(74) *Attorney, Agent, or Firm*—Greer, Burns & Crain, Ltd.

(57) ABSTRACT

Disclosed is a method of preparing anisotropic conductive adhesives for flip chip interconnection on organic substrates, in which an epoxy resin as a binder is mixed with a conductive material and a non-conductive material at room temperature for 3 hours and then, with a coupling agent and a curing agent at room temperature for 1 hour. The anisotropic conductive adhesives are endowed with the electrical conductivity of conventional anisotropic conductive films and the mechanical reliability of an underfill used in a solder flip chip, simultaneously. The ACA shows fast hardenability and excellent coating and screening properties. The adhesive is spread over a plastic printed circuit board into which a flip chip is then brought. The flip chip and the plastic substrate can be bonded to each other using heat and pressure. Also, it is applicable for low-price flip chips and chip size packaging as well as for relevant-assembly packaging.

5 Claims, 4 Drawing Sheets

[FIG.1]
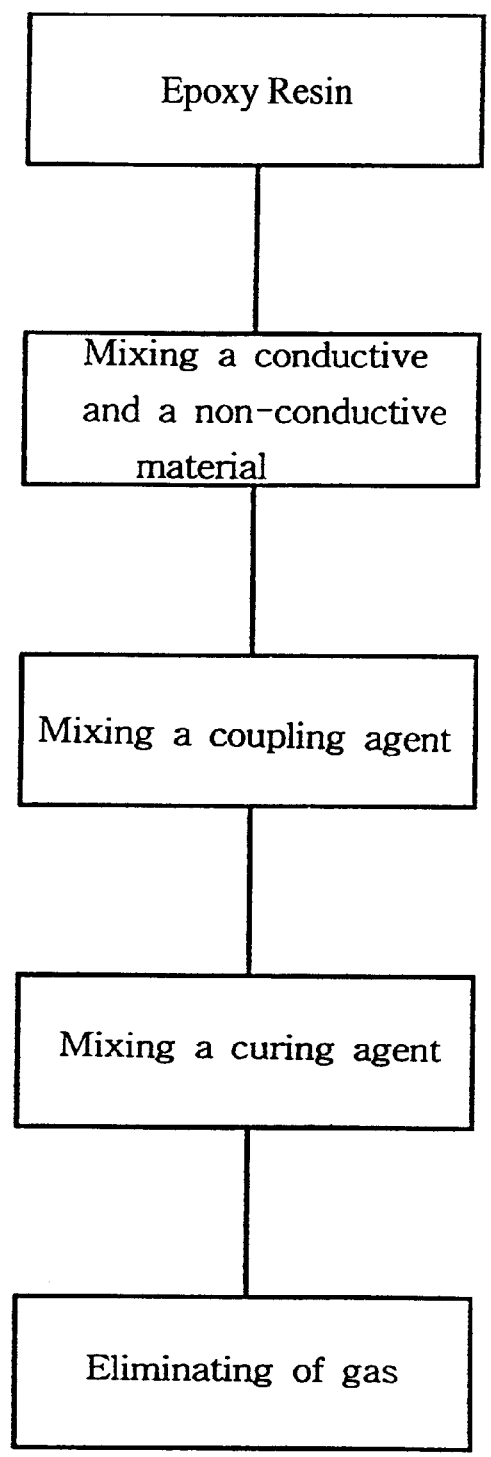

[FIG.2]
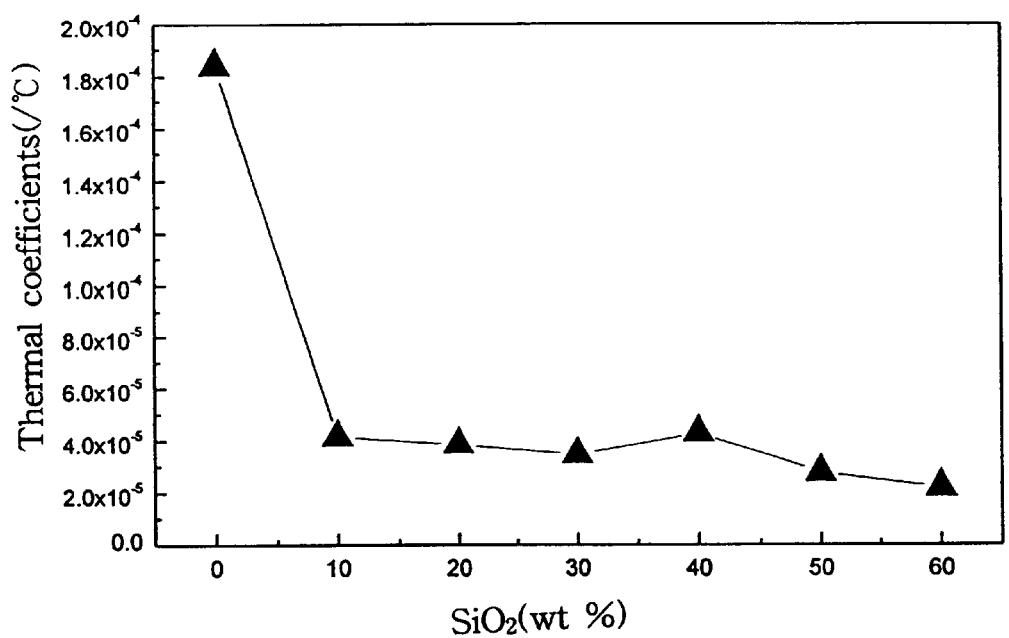

[FIG.3]
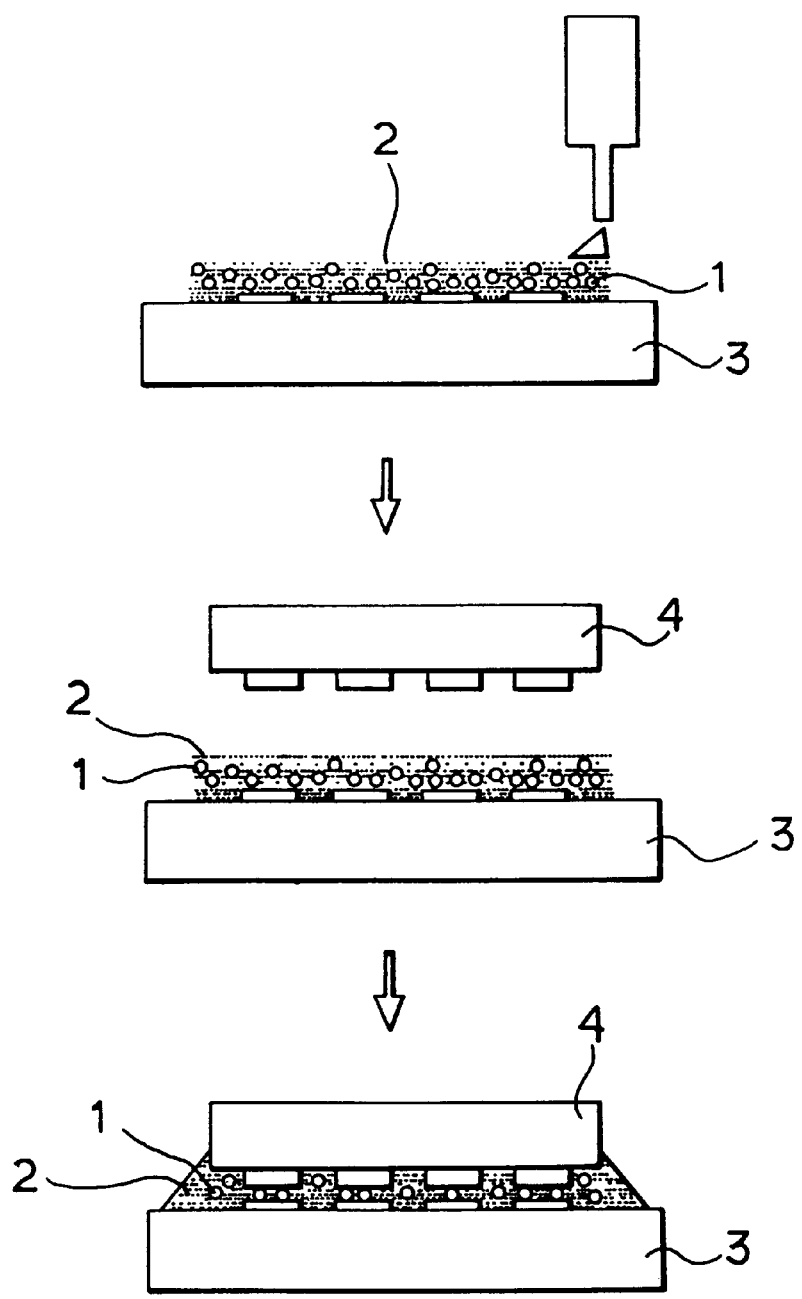

[FIG.4]
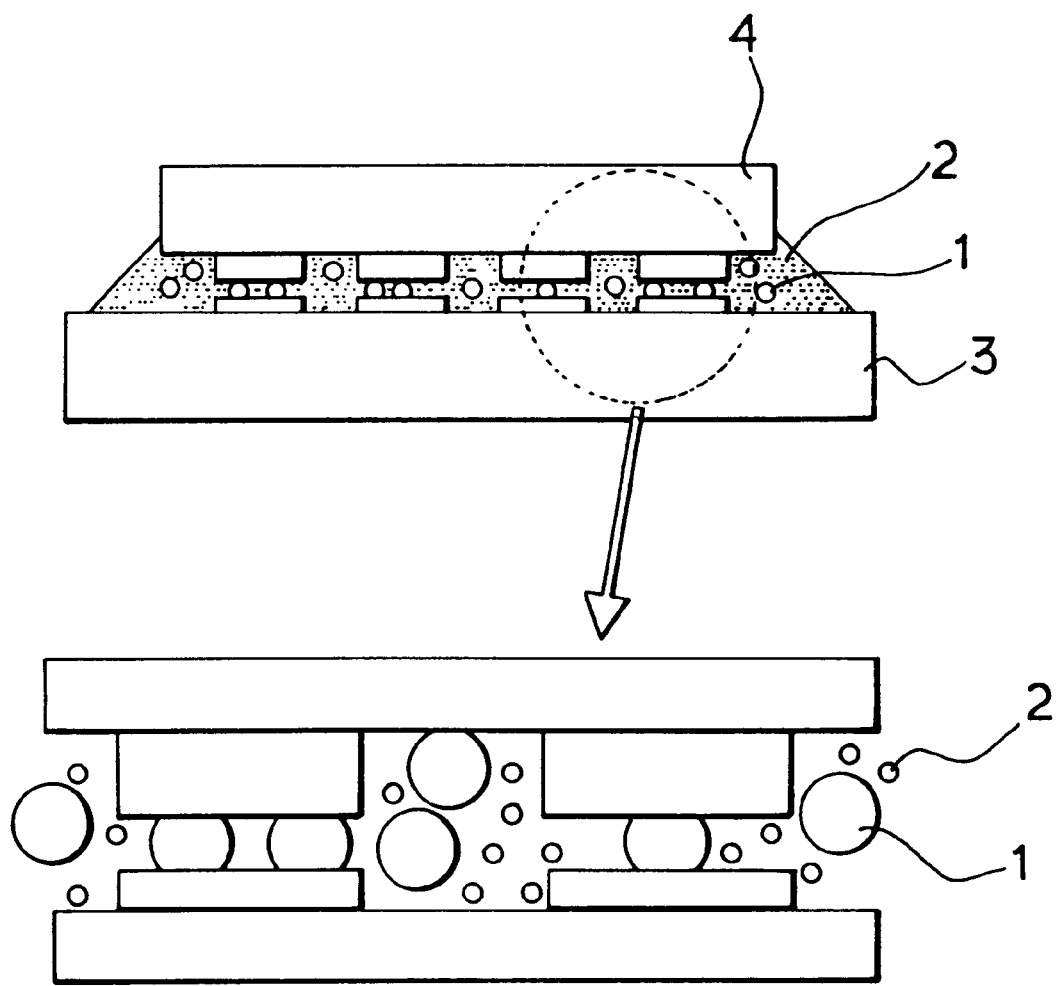

PREPARATION METHOD OF ANISOTROPIC CONDUCTIVE ADHESIVE FOR FLIP CHIP INTERCONNECTION ON ORGANIC SUBSTRATE

FIELD OF THE INVENTION

The present invention relates to a method of preparing an anisotropic conductive adhesive (hereinafter referred to as "ACA") for the interconnection of flip chips onto plastic substrates, which is superior in both electrical conductivity and mechanical reliability.

BACKGROUND OF THE INVENTION

Having been strikingly developed, recent semiconductor technology involves principally the integration of more than a million cells, the establishment of a great number of input/output (I/O) pins on non-memory devices, large die sizes, the radiation of extensive heat, high electrical performance, etc. In spite of its remarkable advance, the semiconductor technology is not completely practiced because electronic package technology has not yet developed to such a level as to back the semiconductor technology. In pursuit of high electric performance, microminiaturization/high density, low-power operation, multifunction, high-speed signal processing, permanent reliability, etc., the electronic package technology is one of the most important factors which have critical influence on the determination of a final product's values, including performance, size, price, reliability, etc. Indispensable applications of microminiaturized package assemblies exist in the recently rapidly growing electronic industries, for example, in the computer, information communication, mobile communication, and high-tech electronic appliance industries. In particular, flip chip technology finds numerous applications in the smart card, liquid crystal display (LCD), plasma display panel (PDP), computer, cellular phone, and communication system industries.

Such flip chip technology has been and is being developed from a connection process using solders to a connection process using conductive adhesives which have advantages of the ability to pitch microelectrodes at low costs, fluxless, environment-friendly processing, and low temperature processing.

Commercially available as an anisotropic conductive film/adhesive type and an isotropic conductive adhesive type, conductive adhesives are composed normally of conductive particles, such as Ni, Au/polymer, and Ag, and thermosetting or thermoplastic insulating resins. Undoubtably, a conductive adhesive which is of more reliability, lower resistance and higher adhesive strength guarantees a better flip interconnection on an organic substrate. For this, necessary is knowledge of the optimal values for the size, distribution, content, and strain modulus of the conductive particles. In addition, it is also required to develop an adhesive resin capable of being cured within a shorter time at a lower temperature, its preparation process, and an ACA which can afford a flip chip process of low cost.

Typically, ACAs are divided into a film type and a paste type. The invention is primarily to develop a paste type of ACAs, which are useful for the interconnection of flip chips on plastic substrates, with the aim of making simple the manufacture of them.

Because flip chip technology using conductive adhesives has not yet been standardized clearly, Hitachi and Sony, leading companies in the conductive adhesive field of the world, European universities which form a multinational research consortium in which conductive adhesives are under systematic study, and company research institutes of many countries keenly compete with each other to dominate the world market through the world standardization of their own products. In particular, electronic package technology, one of the most important fields in producing electronic products, attaches great importance to the materials to be used and their preparation processes. Under this condition, novel connection materials which can replace conventional solder material to meet the tendency toward environment-friendly products as well as guarantee electrical conductivity and reliability are needed and their development is being watched with keen interest.

Prior arts which are relevant to the invention include (1) no-flow underfill technology and (2) conventional ACA. Quite different from the invention, the former, in which an underfill is formed when a solder-formed substrate is connected onto a substrate, does not use conductive particles. The latter suffers from a problem in that it is not of high reliability owing to high thermal coefficient resulting from the existence of oily conductive particles in ACA.

SUMMARY OF THE INVENTION

Therefore, it is an object of the present invention to overcome the problems encountered in prior arts and to provide an ACA which is endowed with the electrical conductivity that conventional anisotropic conductive films have and the mechanical reliability that the underfill used in a solder flip chip shows, simultaneously.

In accordance with the present invention, there is provided a method of preparing anisotropic conductive adhesives for flip chip interconnection on organic substrates, in which an epoxy resin as a binder is mixed with a conductive material and a non-conductive material at room temperature for 3 hours and then, with a coupling agent and a curing agent at room temperature for 1 hour, whereby the anisotropic conductive adhesives can bond flip chips to the organic substrates with high mechanical reliability.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a process flow showing the preparation of the ACA according to the present invention;

FIG. 2 is a graph in which the thermal coefficients of the ACA are plotted with regard to the amounts of non-conductive particles;

FIG. 3 illustrates a procedure of the interconnection of a flip chip onto a plastic substrate by use of the ACA according to the present invention; and FIG. 4 is a schematic cross sectional view showing a bumped chip bonded to a substrate through the ACA of the invention.

DETAILED DESCRIPTION OF THE INVENTION

In the present invention, an ACA is based on a liquid epoxy resin in combination with a conductive material and a non-conductive material. Its preparation process is illustrated in FIG. 1. The liquid epoxy resin is mixed with the conductive and the non-conductive materials at room temperature for 3 hours and then, added with a coupling agent and a curing agent, and mixing is further conducted at room temperature for 1 hour.

Useful as the base resin in the present invention is a bisphenol F type epoxy resin. Unlike conventional epoxy resin-based adhesive/film, the invention does not employ various kinds of epoxy resins nor a solvent for controlling viscosity.

As for the conductive material, it is a solder, a gold-coated polystyrene, a sliver or a nickel powder with a diameter of 5–10 μm. It is used at an amount of 6–20% by weight based on the weight of the ACA. Serving to control the physical properties of the epoxy resin, the non-conductive material is an alumina ($Al_2O_3$), a beryllia (BeO), a silicon carbide (SiC), or a silica ($SiO_2$) powder with a diameter of 0.1–1 μm and is used at an amount of 30–50% by weight based on the weight of the ACA. As shown in FIGS. 3 and 4, the conductive material 1 has to be larger than the non-conductive material 2 in order that the conductive particles 1 come into contact with bumps of a chip 4 and electrodes of a substrate 3 simultaneously, to provide conductivity therebetween. Meanwhile, the non-conductive material 2 has an influence on the physical properties, such as thermal coefficient, of the adhesive in the vicinity of the contact sites between the bumps of the chip 4 and the electrodes of the substrate 3.

As the coupling agent, it is selected from the group consisting of 3-glycidyloxy propyl trimethoxy silane, 2-(3, 4-epoxycyclohexyl)-ethyl trimethoxy silane and 3-glycidyloxy propyl methyl diethoxy silane. It functions to uniformly disperse the mixture of the conductive material 1 and the non-conductive material 2 within the liquid epoxy resin and to prevent the precipitation of the mixture. Its preferable amount is within the range of 3–5% by weight based on the weight of the ACA. The curing agent is used to thermally cure the epoxy resin and is added at an amount of 30–50% by weight based on the weight of the epoxy resin. Useful as the curing agent in the present invention is 2-methylimidazole of HX3941 HP or HX3948 HP, both commercially available from Asai Ciba, Japan.

A better understanding of the present invention may be obtained in light of the following examples which are set forth to illustrate, but are not to be construed to limit the present invention.

EXAMPLE I

In this example, an ACA was prepared through the process illustrated in FIG. 1. It used an epoxy resin of bisphenol F type as a binder. As a conductive material 1, a nickel powder with a diameter of 5 μm, which is superior in mechanical strength, electrical conductivity, and magnetic field arrangement, was added at an amount of 6% by weight while a silica ($SiO_2$) powder 1 μm in diameter was added at an amount of 10% by weight as a non-conductive material 2. After being mixed at room temperature for 3 hours, the mixture was added with 3% by weight of 3-glycidyloxy propyl trimethoxy silane as a coupling agent and with HX3941, an imidazole-based curing agent sold by Asai Ciba, Japan, at an amount of 50% by weight based on the weight of the epoxy resin so as to thermally cure the epoxy resin. Mechanical mixing was conducted at room temperature for 1 hour to afford an ACA while air bubbles were removed by vacuuming.

EXAMPLE II

An ACA was prepared in a similar manner to that of Example I, except that a nickel powder, as a conductive material 1, with a diameter of 5 μm was added at an amount of 10% by weight and a silica powder ($SiO_2$), as a non-conductive material 2, with a diameter of 1 μm at an amount of 50% by weight.

EXAMPLE III

An ACA was prepared in a similar manner to that of Example I, except that a nickel powder, as a conductive material 1, with a diameter of 5 μm was added at an amount of 15% by weight and a silica powder ($SiO_2$), as a non-conductive material 2, with a diameter of 1 μm at an amount of 45% by weight.

EXAMPLE IV

An ACA was prepared in a similar manner to that of Example I, except that a nickel powder, as a conductive material 1, with a diameter of 5 μm was added at an amount of 20% by weight and a silica powder ($SiO_2$), as a non-conductive material 2, with a diameter of 1 μm at an amount of 40% by weight.

TEST EXAMPLE

After curing, the adhesive was examined for the change in thermal coefficient with regard to the amount of the non-conductive material 2. For the examination, the amount of the nickel powder, as the conductive material 1, was fixed at 10% by weight while the content of the silica ($SiO_2$) powder, as the non-conductive material 2, was changed from 0 to 60% by weight. The coupling agent and the curing agent were used at the same amounts as in Example I. An examination was made of the thermal coefficients of the adhesives through the thermo mechanical analysis in which the samples were measured for length change while the temperature was elevated from room temperature to 250° C. at a rate of 5° C. per min. The results are given in FIG. 2. As shown in the plot of FIG. 2, the thermal coefficient was greatly dropped at a silica content of 10% by weight and then, gradually decreased to the lowest value at a silica content of 50–60% by weight. That is, an optimal property can be obtained when using nickel and silica at an amount of 10% by weight and 50% by weight, respectively.

APPLICATION EXAMPLE: Flip Chip Interconnection

The ACA prepared in Example II was applied for the interconnection of a chip onto an organic substrate, as shown in FIG. 3. First, the ACA was dispersed over a plastic substrate 3 which had been maintained at 80° C. in order for the better dispersion of the ACA. Then, a bumped chip 4 and the plastic substrate 3 were arranged so that the bumps of the chip 4 were positioned corresponding to the electrodes of the substrate 3. Using a flip chip bonder, the chip 4 was pressed onto the substrate at 150° C. to cure the adhesive within 5 min to bond the bumps of the chip 4 to the electrodes of the substrate 3. When dispensing the adhesive over the plastic substrate 3, the epoxy resin was deprived of the solvent in order to maintain the viscosity of the adhesive at 200, 000–400,000 centipoise (Cp), with which screen printing could be conducted, and thus to improve the coating workability.

As described hereinbefore, the ACA according to the present invention is endowed with an electrical performance similar to those of conventional anisotropic conductive films and a mechanical reliability similar to that of a solder flip chip using an underfill. In addition, the ACA of the present invention shows fast hardenability and excellent coating and screening properties and its preparation is relatively simple.

Further, it is applicable for low-price flip chips and chip size packaging as well as for relevant-assembly packaging.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of preparing anisotropic conductive adhesives for flip chip interconnection on organic substrates, in which an epoxy resin as a binder is mixed with a conductive material and a non-conductive material at room temperature for 3 hours and then, with a coupling agent and a curing agent at room temperature for 1 hour, whereby the anisotropic conductive adhesives can bond flip chips to the organic substrates with high mechanical reliability.

2. A method as set forth in claim 1, wherein the coupling agent is selected from the group consisting of 3-glycidyloxy propyl trimethoxy silane, 2(3,4-epoxycyclohexyl)-ethyl trimethoxy silane and 3-glycidyloxy propyl methyl diethoxy silane and used at an amount of 3–5% by weight.

3. A method as set forth in claim 1, wherein the curing agent is 2-methylimidazole, and its content ranges from 30 to 50% by weight based on the weight of the epoxy resin.

4. A method as set forth in claim 1, wherein the conductive material is selected from the group consisting of a solder powder, a gold-coated polystyrene polymer powder, a silver powder and a nickel powder, all powders ranging, in diameter, from 5 to 10 $\mu$m, and used at an amount of 6 to 20% by weight.

5. A method as set forth in claim 1, wherein the non-conductive material is selected from the group consisting of an alumina ($Al_2O_3$) powder, a beryllia (BeO) powder, a silicon carbide (SiC) powder, and a silica ($SiO_2$) powder, all powders ranging, in diameter, from 0.1 to 1 $\mu$m, and used at an amount of 30 to 50% by weight.

* * * * *